US005675622A

United States Patent [19]

Hewitt et al.

[11] Patent Number: 5,675,622

[45] Date of Patent: Oct. 7, 1997

[54] METHOD AND APPARATUS FOR ELECTRONIC ENCODING AND DECODING

[75] Inventors: Kent Hewitt, Mesa; Willem Smit, Phoenix; Emile van Rooyen, Phoenix; Frederick Bruwer, Phoenix, all of Ariz.

[73] Assignee: Microchip Technology Incorporated, Chandler, Ariz.

[21] Appl. No.: 611,994

[22] Filed: Mar. 5, 1996

[51] Int. Cl.[6] .................................................... H03K 21/00

[52] U.S. Cl. ................................ 377/33; 377/26; 377/34

[58] Field of Search ................................ 377/33, 34, 26

[56] References Cited

U.S. PATENT DOCUMENTS

| | | | |
|---|---|---|---|
| 5,126,959 | 6/1992 | Kurihara | 369/717 |
| 5,204,901 | 4/1993 | Hershy et al. | 380/21 |
| 5,564,025 | 10/1996 | De Freese et al. | 395/270 |

OTHER PUBLICATIONS

Electronics Letters Aug. 1967 vol. 3 No. 8.

*Primary Examiner*—Margaret Rose Wambach
*Attorney, Agent, or Firm*—Matthew G. Reeves

[57] ABSTRACT

According to the present invention there is provided an encoder, which in one embodiment, includes a processing circuit which generates an output code according to an encoding algorithm, a counter circuit for incrementing a counter value such that only one bit of the counter value changes each time the counter value is incremented, a non-volatile memory for storing the counter value, and a transmitter which transmits the output code and the counter value. In another embodiment of the invention there is provided a method for use with an encoder having a processing circuit which generates an output code according to an encoding algorithm, a counter circuit for incrementing a counter value, a non-volatile memory for storing the counter value, and a transmitter which transmits the output code and the counter value. In one embodiment, the method includes the steps of incrementing the counter value such that only one bit is changed each time the counter is incremented. In still a further embodiment the method includes the steps of using a semaphore register and determining whether the semaphore register is set to 0.

5 Claims, 11 Drawing Sheets

METHOD AND APPARATUS FOR ELECTRONIC ENCODING AND DECODING

BACKGROUND OF THE INVENTION

This invention relates generally to the field of electronic encoding and decoding, and more particularly to encoders and decoders useful for transmitting and receiving secure signals for remotely controlling systems. Still more particularly, the invention relates to the field of synchronizing encoders and decoders in low power environments.

Controlling systems and devices by remote control is becoming increasingly popular in many applications. Examples of such applications are numerous, some of the most common include security systems for buildings, security systems for vehicles, garage door and gate openers. These systems typically employ a transmitter to send an encoded signal to a receiver which decodes the signal and causes the desired operation to be performed. Of course, as these systems become more widely used, unscrupulous efforts to defeat them also increase.

For example, in relatively unsophisticated systems, a single fixed code is transmitted to a receiver which has been configured to operate in response to only that particular code. However, a fixed code system is easily defeated by several methods. One method is to use a device called a code scanner which transmits all possible combinations of fixed codes. For example, in systems using eight DIP switches to select the code, there are only two hundred and fifty-six (256) possible fixed code combinations. A code scanner can typically transmit this number of combinations in less that thirty-two seconds. Even in systems using sixteen bit keys, yielding 65,536 combinations, only a little more than two hours would be required to try all possible combinations. Moreover, the scanner may gain access in far less than this maximum time, in fact, the average time would be half of the maximum time.

Another way of gaining unauthorized access is to simply intercept and retransmit the signal. For example, a remote control transmitter of the type normally used in vehicle security and remote control systems includes a small radio transmitter that transmits a code number on a specific frequency. This code number is normally generated by an integrated circuit encoder. The transmission frequency is usually fixed by legislation within a particular country, therefore it is possible to build a receiver that can receive signals from all such transmitters. Such a receiver is used together with a circuit which records the transmissions captured by the intended receiver. Such a device is known as a code or key grabber and can be used to gain access to protected premises or to vehicles with remote control security systems.

To control the threat of unauthorized access, remote control systems have become increasingly sophisticated.

One method of overcoming the limitations of fixed code systems is to employ code hopping encoders. Code-hopping encoders typically use an algorithm which generates a different code each time the transmitter is operated. At the receiving end, a decoder is provided with a corresponding algorithm for decoding the received transmission.

In order for the algorithm to generate a different code each time the transmitter is operated, a counter is used. A counter is incremented each time the unit is operated, and the counter value is provided as a parameter to the encoding algorithm. At the decoder, a corresponding counter is maintained each time a valid transmission is received, and this counter is compared to the counter value received from the encoder.

In order for the proper operation between the transmitter and receiver, the counter value in each unit must be synchronized. If the counter values fall out of synchronization, then the transmitter will no longer be able to communicate with the receiver. Therefore, the counter value is typically stored in nonvolatile memory. If power should be removed from one of the system units, for example, a battery dies in the transmitter, the counter value will be maintained.

However, storing the counter value in nonvolatile memory does not necessarily ensure proper synchronization because other events may cause the counters to get out of sync. For example, if the transmitter is operated out of range of the receiver, then the encoder counter will be incremented, but the decoder counter will not. This problem is addressed by causing the decoder to "look ahead" a certain number of counts, to see if a valid code has been received. This technique works well when the encoder counter is ahead of the decoder counter by a small number of increments.

A more serious problem occurs when the encoder count falls behind the decoder count. Specifically, in order to prevent a code grabbing device from gaining access to the system by supplying a previously used code to the decoder, it is important that the decoder block the use of previously used codes. Therefore, should the encoder counter value lag the decoder counter value the look ahead feature of the decoder will not be useful to re-synchronize the system.

Further, the problem of the encoder counter value falling behind the decoder counter value is exaggerated by the fact that many encoder devices are battery-powered, hand-operated units. Therefore, when the battery power falls below a certain level, the likelihood of the encoder counter falling behind increases due to the possibility of defective writes to the nonvolatile memory referred to as "soft writes".

SUMMARY OF THE INVENTION

According to the present invention there is provided an encoder, which in one embodiment comprises a processing circuit which generates an output code according to an encoding algorithm, a counter circuit for incrementing a counter value such that only one bit of the counter value changes each time the counter value is incremented, a non-volatile memory for storing the counter value, and a transmitter which transmits the output code and the counter value.

In another embodiment of the invention there is provided a method for use with an encoder having a processing circuit which generates an output code according to an encoding algorithm, control logic for incrementing a counter value, a non-volatile memory for storing the counter value, and a transmitter which transmits the output code and the counter value. In one embodiment, the method comprises incrementing the counter value such that only one bit is changed each time the counter is incremented. In still a further embodiment the method comprises using a semaphore register and determining whether the semaphore register is set to 0.

BRIEF DESCRIPTION OF THE DRAWINGS

The invention is further described by way of example with reference to the accompanying drawings in which.

It is to be understood that these drawings are for purposes of illustration only, and are not to be considered limiting of the invention because the invention may admit to other equally effective embodiments.

BRIEF DESCRIPTION OF EMBODIMENTS OF THE INVENTION

Figure 1:
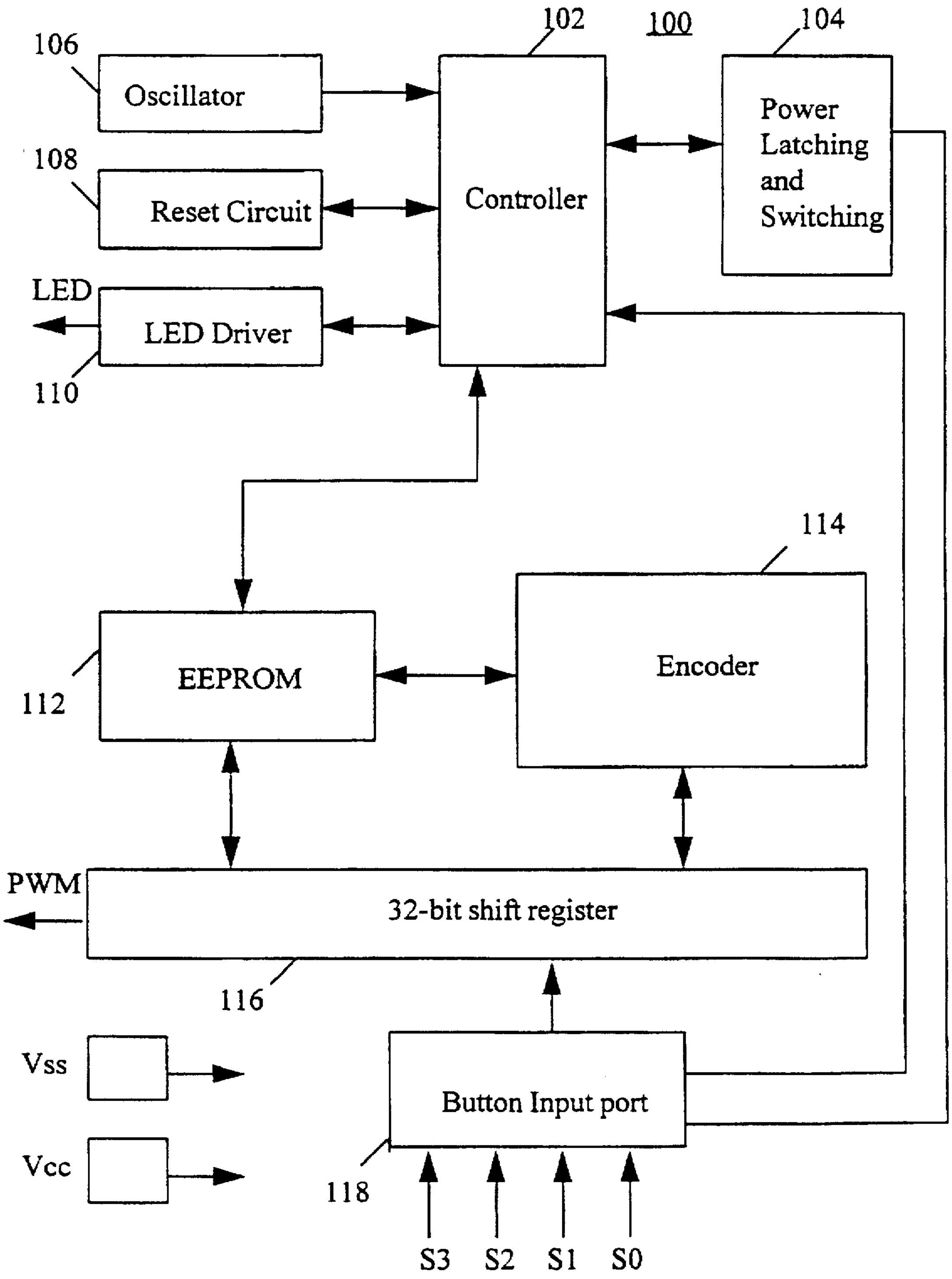
FIG. 1 is a block diagram of an encoder according to an embodiment of the invention.

Referring now to FIG. 1, there is shown a block diagram of a device useful in a secure remote control system according to an embodiment of the invention. As shown, the device 100 comprises a controller 102 which operates in conjunction with a power latching and switching circuit 104, a reset circuit 108, an oscillator 106, an LED driver 110 and a keyboard or button input port 118. The controller 102 serves to perform the basic housekeeping functions of the remote control device 100 such as receiving user input through buttons S0–S3, providing status information to a user via the LED driver circuit 110, and writing information, such as user input, to nonvolatile memory 112. In this case, nonvolatile memory 112 is EEPROM.

The device 100 also comprises an encoder 114, for performing an encoding function, which operates with information stored in EEPROM 112 to read and write information into the 32 bit shift register 116. The information in register 116 is then provided to a transmitter (not shown) to be transmitted to the corresponding receiving unit. Of course, it is understood that the exact implementation of the controller 102 circuit, as well as, the peripheral circuits such as oscillator 106, reset circuit 108 and LED driver 110 is not critical and one of skill in the art would be capable to construct acceptable circuits based upon his or her own of set of design criteria.

Figure 1A:
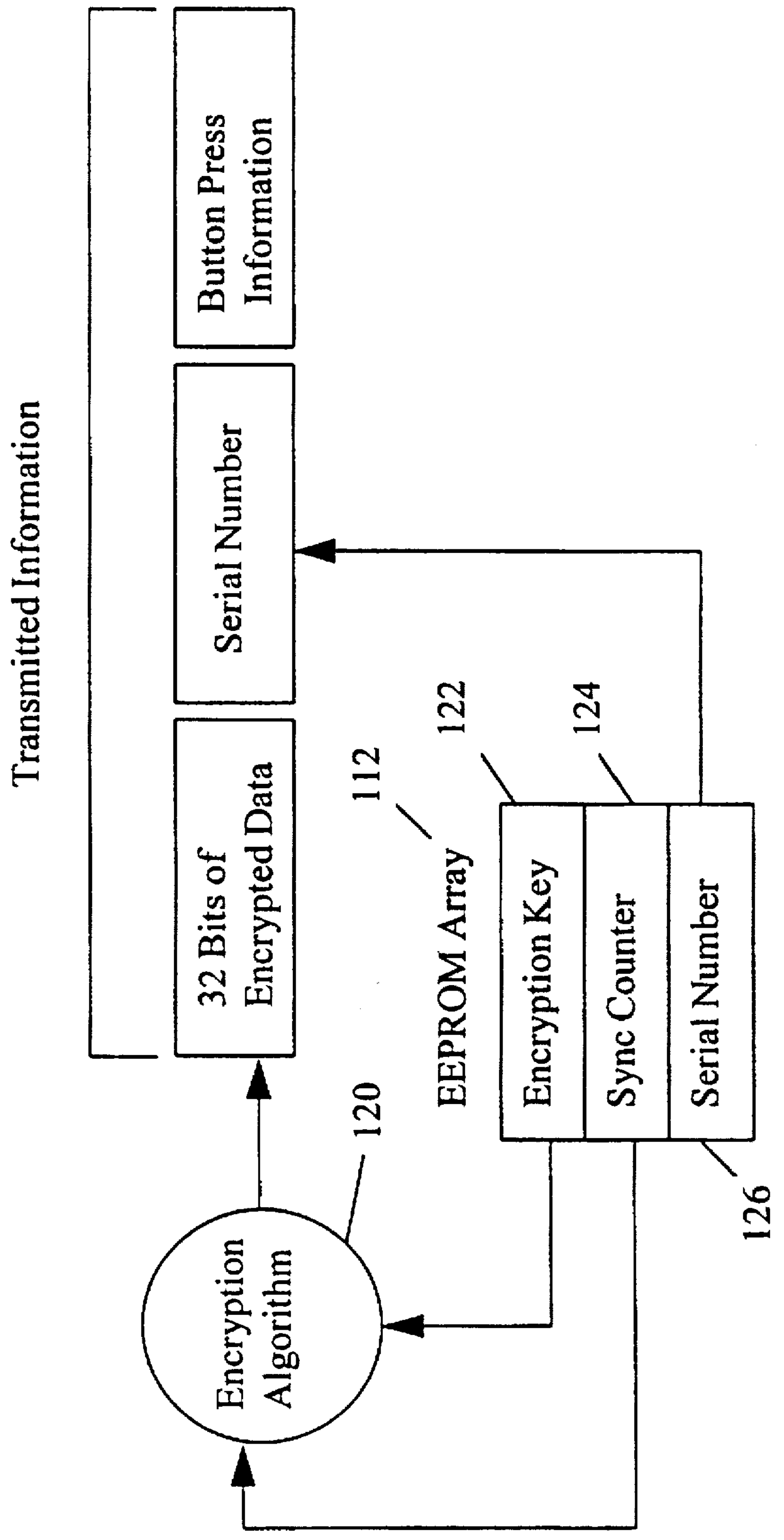
FIG. 1A is a block diagram of an encoder according to one embodiment of the invention.

FIG. 1A is a block diagram illustrating the operation of encoder 114 according to another embodiments of the invention. In this embodiment, the encoder 114 comprises an encoding, or encryption algorithm 120. The encryption algorithm 120 receives input from data stored in EEPROM 112. In this embodiment, the data from EEPROM 112 provided as input to the encryption algorithm 120 comprises an encryption key 122, a synchronization counter value 124, and a serial number 126. This data may be programmed into the EEPROM through any number of techniques known in the art, such as a serial interface.

In the illustrated embodiment, the serial number 126 for each device is programmed by the manufacturer at the time of production. Similarly, the generation of the encryption key 122 is performed using a key generation algorithm which takes as input, for example, a manufacturer's code and the transmitter serial number, and generates the encryption key 122. Suitable key generation algorithms are well known to those skilled in the art and will not be further described, except in relation to the operation of encoder 114.

Figure 1B:
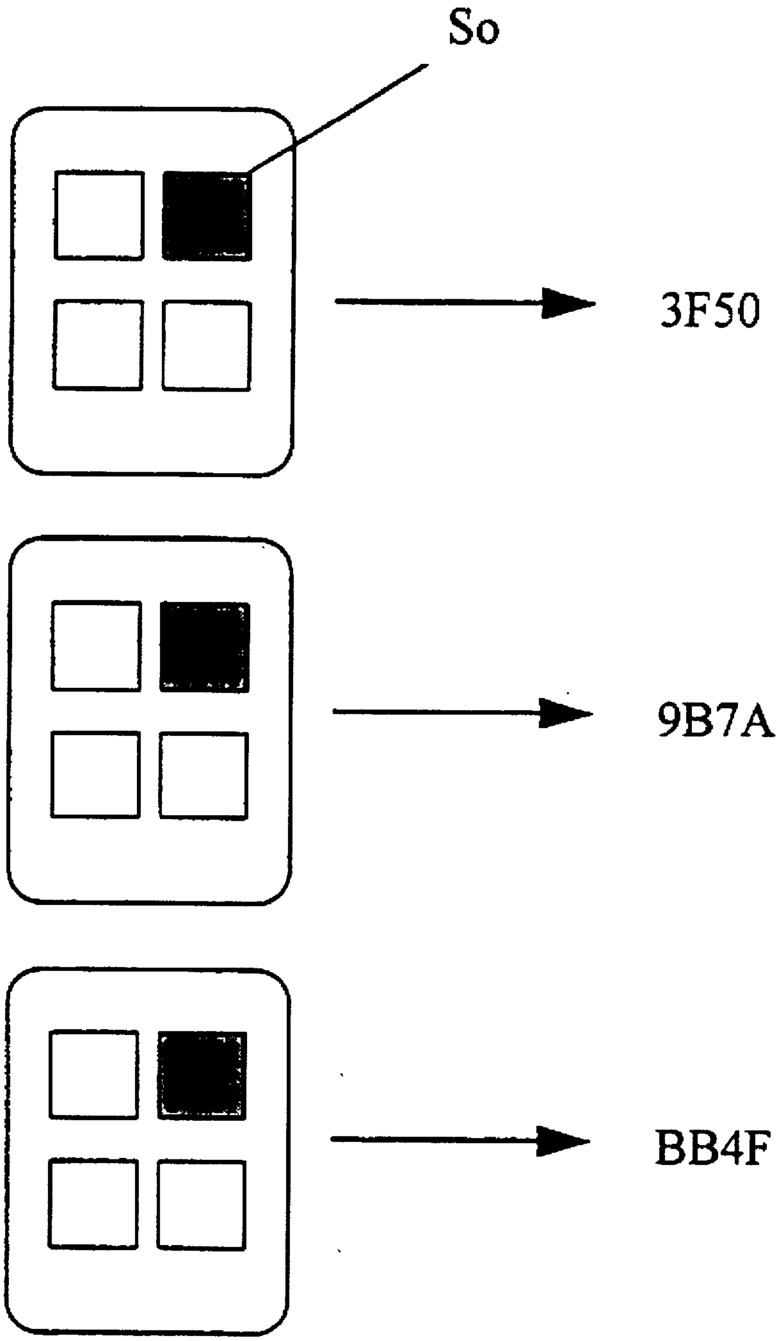
FIG. 1B is a diagram showing operation of a code hopping encoder.

The synchronization counter value 124 is the basis for the transmitted code changing for each transmission and is updated each time a transmission occurs. Because of the complexity of the encryption algorithm 120, a change in one bit of the synchronization counter 124 will result in a large change in the actual transmitted code. This is illustrated with respect to FIG. 1B which shows three consecutive hexadecimal outputs of the encoder 114 in response to three user inputs on button S0.

Any type of encryption algorithm 120 may be used with the present invention, but typically the encryption algorithm is a non-linear block cypher algorithm. Such algorithms are familiar to those of skill in the art. See, for example, U.S. Pat. Nos. 5,055,701 and 4,928,098, incorporated herein by reference.

Figure 1C:
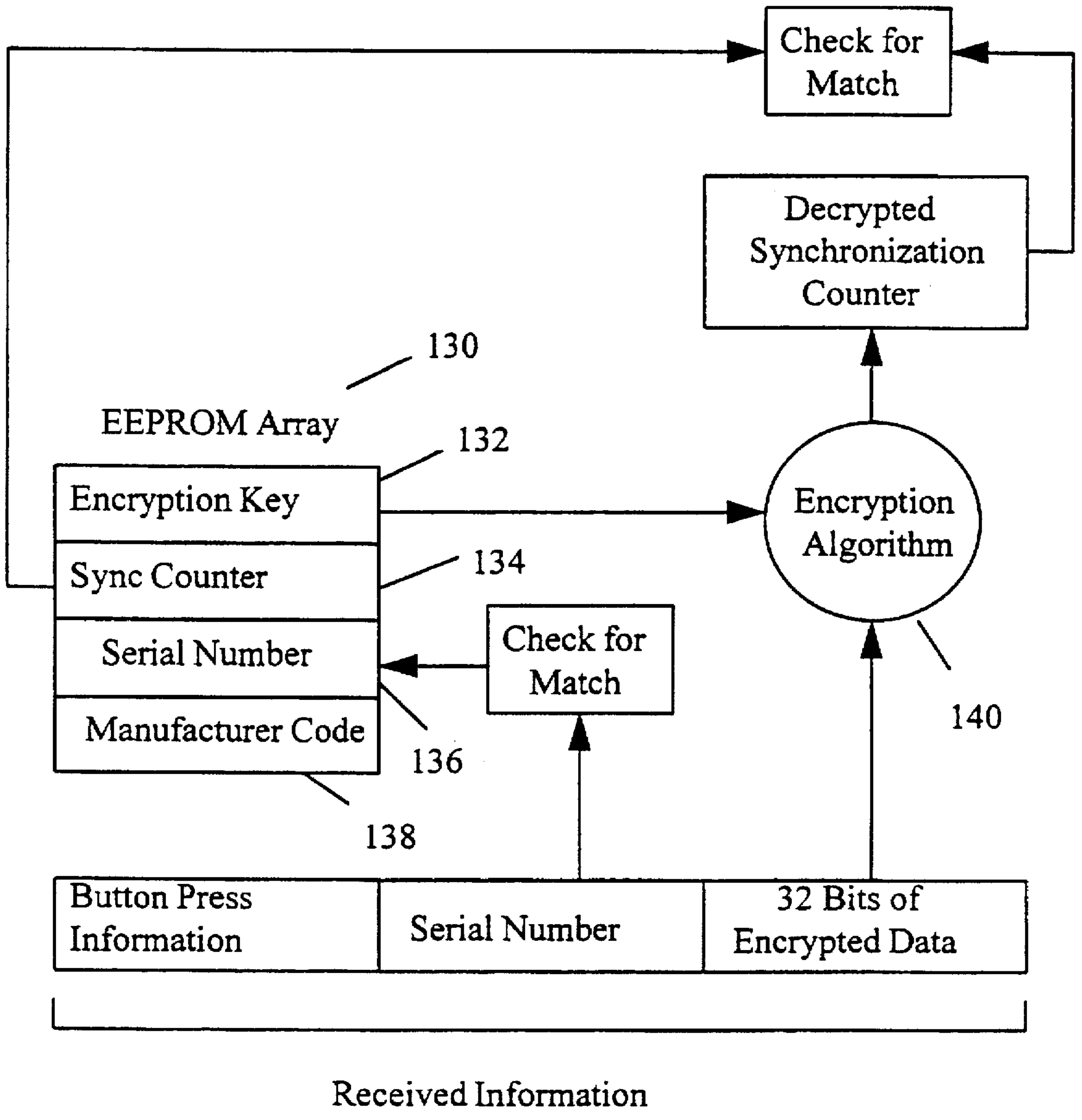
FIG. 1C is a block diagram of a decoder according to an embodiment of the invention.

FIG. 1C illustrates the basic operation of a decoder according to an embodiment of the invention. As shown, the decoder also comprises EEPROM memory 130 which includes an encryption key 132, a synchronization counter 134 and a serial number 136. Each of these registers corresponds to similar cylinder registers within EEPROM 114 in the encoder. Similarly, the decoder also comprises an encryption algorithm 140 which corresponds to the encryption algorithm 120 of the encoder. In the decoder, however, the encryption algorithm 140 is used to decode rather than encode, information provided by the encoder 120.

Since the inputs to the encryption algorithm 140 correspond to similar inputs provided to the encryption algorithm 120 of the encoder, the decrypted data will exactly match the information which was originally encrypted by the encoder and sent to the decoder. Of course, this is true only as long as the synchronization counter 124 of the encoder contains a counter value greater than the synchronization counter 134 of the decoder, but still within a predetermined window of increments. If not, then the encoder will not be able to successfully communicate with the corresponding decoder.

Figure 2:
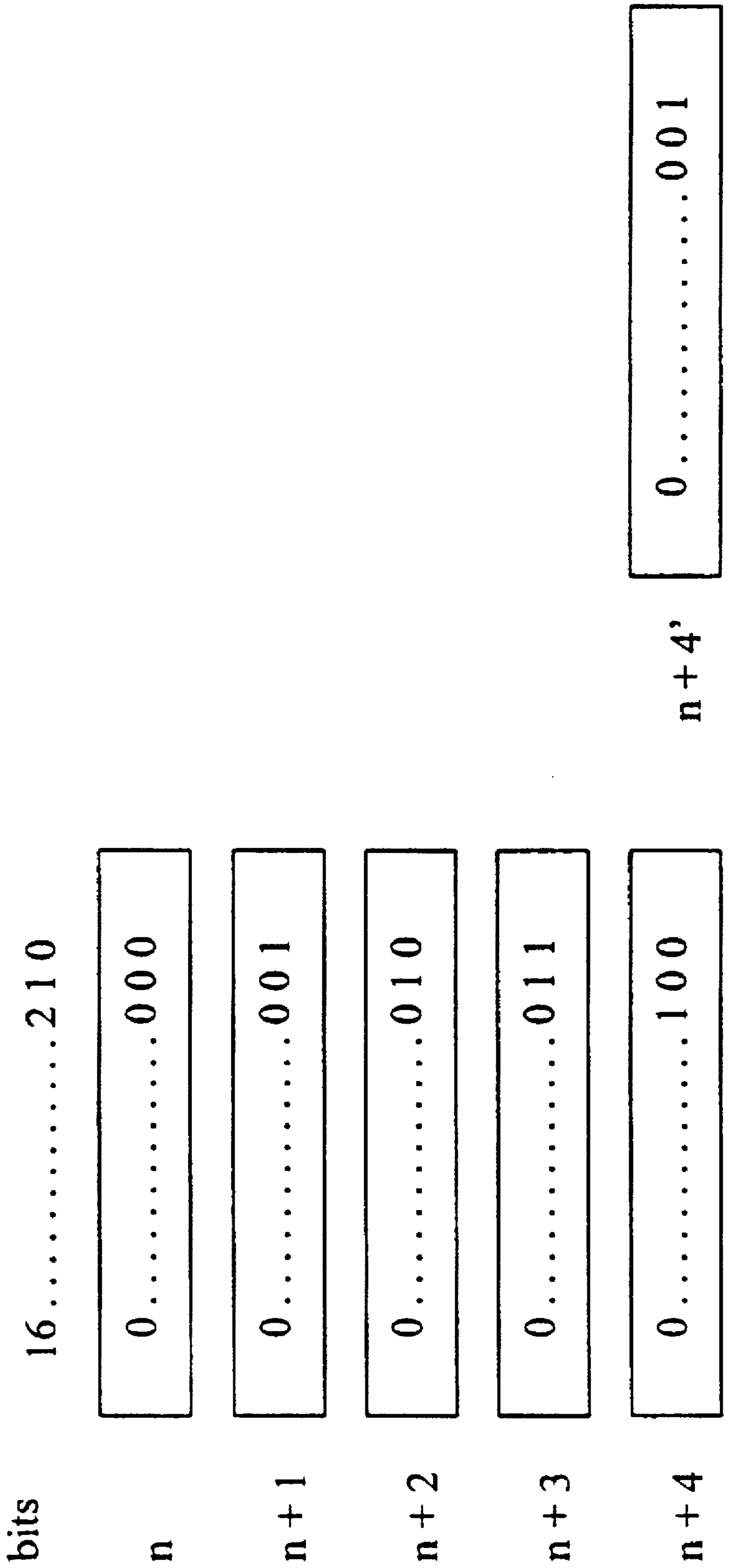
FIG. 2 is a flow diagram illustrating operation of a binary counter and the effect of a defective write to memory.
Figure 3:
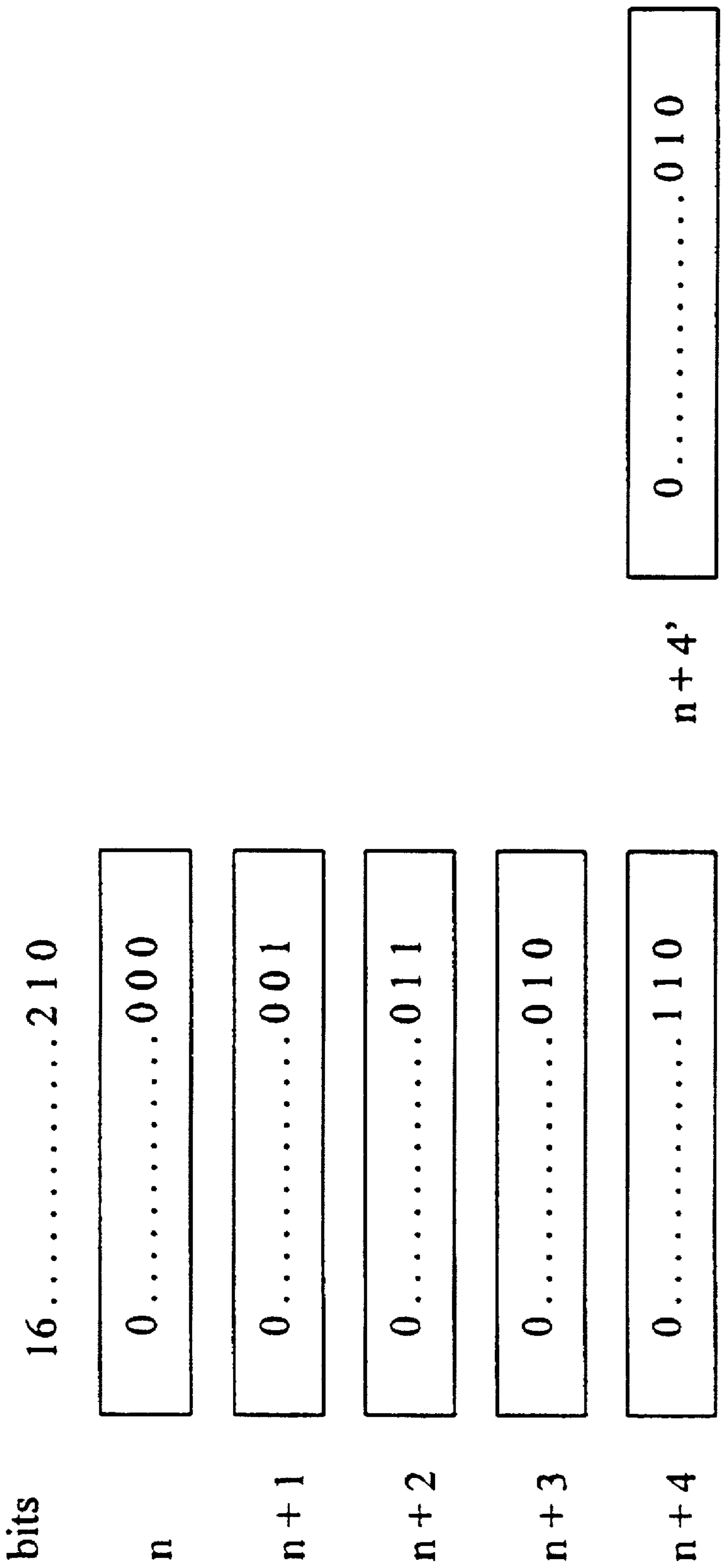
FIG. 3 is a flow diagram showing operation of a counter according to an embodiment of the invention.

In order to ensure proper synchronization between the synchronization counter value 124 and the synchronization counter value 134, the present invention provides a method for incrementing the counter values which is described with respect to FIGS. 2–3.

FIG. 2 shows an example of a synchronization counter register, 16 bits in length, which is incremented from state n to state n+4 in binary fashion. However, a binary counter has a drawback when the battery power of the encoder begins to drop. Specifically, since the counter value is stored in nonvolatile memory, such as EEPROM, the potential for soft, or marginal, writes is increased. Protection must also be provided against incomplete or interrupted write cycles. Soft writes can occur when the battery is nearly dead and may indicate a different value depending on environmental conditions such as temperature and battery voltage. The low power battery condition is described in detail with respect to FIG. 2A. Soft writes or incomplete writes may also occur when the power source is removed at a critical point in the write cycle. Any of these events may result in a counter value of low integrity, resulting in possible failure in the encoder/decoder synchronization.

Figure 2A:
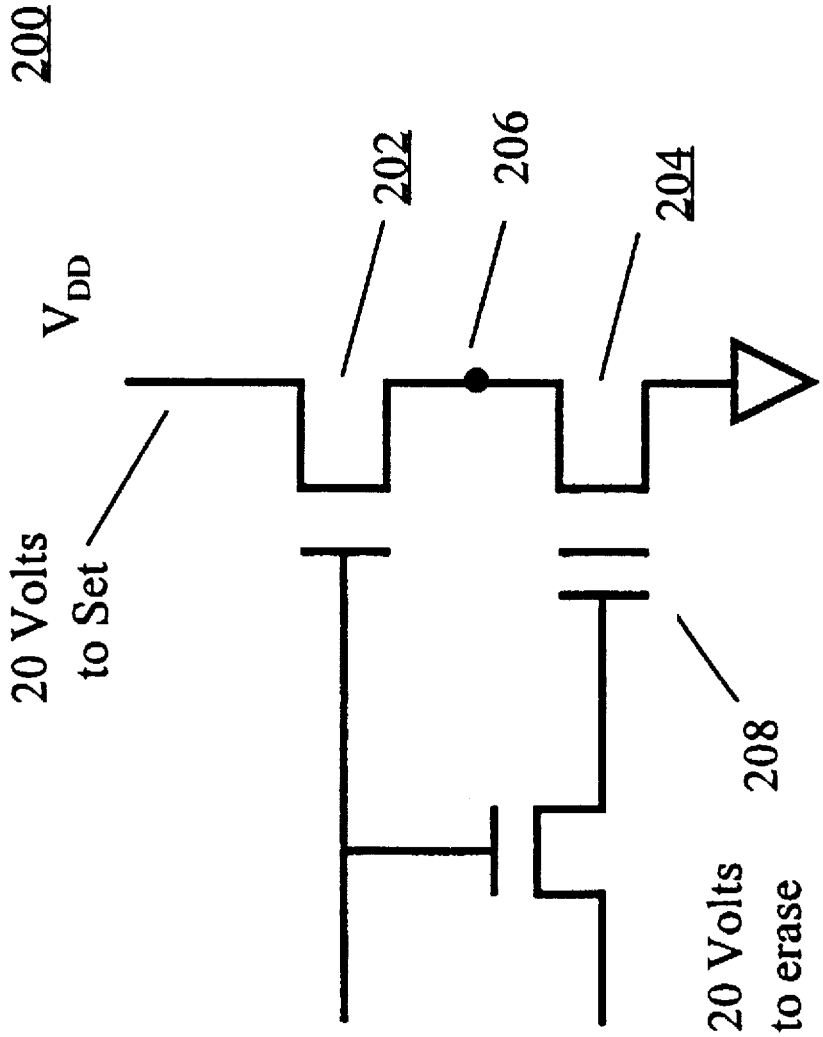
FIG. 2A is a schematic of a circuit EEPROM memory cell useful in the present invention.

FIG. 2A shows a single cell 200 of an EEPROM memory circuit. The cell 200 comprises two transistors 202 and 204. The voltage at node 206 is sampled to determine whether the cell indicates a logical 1 or a logical 0. In order to set node 206 to indicate a logical 0, a high voltage, for example 20 volts, is placed on the source VDD of transistor 202. This causes charge to be drawn off the floating gate 208 of transistor 204 to set node 206 to ground. When the cell is then sampled, the cell will indicate a logical 0. However, as the battery power drops, it may not be possible to provide the full 20 volts at VDD. If a lower voltage, for example 10 volts, is applied to VDD during the write operation, then node 206 will still be pulled low, but it may not be pulled low enough to reliably indicate a logic level of 0 when the cell 200 is sampled.

Referring again to FIG. 2, the effect of a soft write is illustrated. As shown, when the counter register is incremented from the value at n+3 to the value at n+4, it is seen that each of bits 0, 1 and 2 must change. Battery power is low and soft writes occur at bits 0 and 2, then the actual contents of the sync counter value may appear as shown in n+4'.

Therefore, after n+4 counter increments, the decoder counter should read as shown in register n+4 which contains the binary representation of the Number 4. But, due to soft writes, the encoder counter actually reads as shown in register n+4' which contains the binary representation of the Number 1. Therefore, the encoder counter is now 3 increments behind the decoder counter. Of course, it is recognized that if this error occurs in more significant bits, then it is possible that with one soft write, the encoder value could fall thousands of increments behind the decoder value, thus rendering the encoder useless.

This difficulty is addressed in one embodiment invention in which a method for incrementing the counter value is provided by control logic which changes only one bit each time the counter is incremented. This is illustrated with respect to FIG. 3. FIG. 3 shows an example of an encoder register which is incremented n+4 times. Each time the counter register is incremented, only one bit is allowed to change. Therefore, a soft write can never cause the encoder counter register to fall behind more than one increment. This is illustrated with respect to the counter value as shown in n+4 and n+4' of FIG. 3. In this example, bit 2 has failed, but the counter value n+4' is only one increment behind the decoder counter value n+4. One example of an acceptable counter, or control logic, is a Gray code counter, examples of which are known to those of skill in the art.

Of course, even providing the Gray code counter does not completely prevent the problem of the encoder counter value failing behind the decoder counter value. Therefore, in another embodiment of the invention, a semaphore register is also provided in EEPROM memory to further insure the proper synchronization between the encoder and the decoder.

Figure 4:
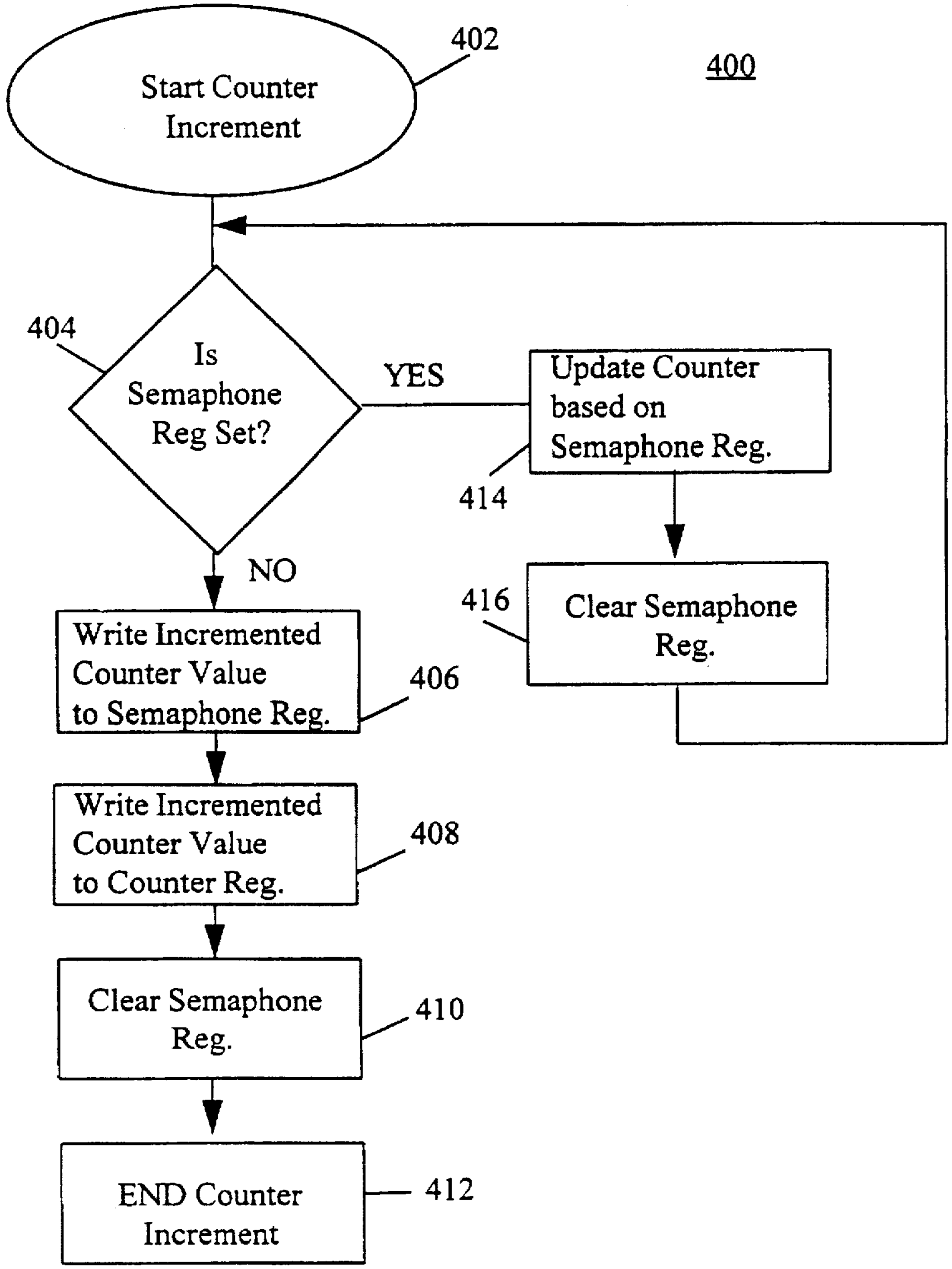
FIG. 4 is a flow chart showing operation of a semaphore register according to an embodiment of the invention.

FIG. 4 shows a flow chart describing the use of a semaphore register according to one embodiment of the invention. As shown, the counter increment is begun in Step 402. Flow passes to Step 404 in which the encoder tests the semaphore register to see if it is cleared, i.e., all bits in the semaphore register are set to a logical zero. If the semaphore register, is zero, then flow passes to Step 406 in which the incremented counter value is written to the semaphore register in EEPROM memory. Of course, it is understood that in the version of the invention in which the counter is a Gray counter, only one bit is changed on each increment. Therefore, the entire counter value is not written to the semaphore register, only the bit which must change. Next, flow passes to Step 408 in which the incremented counter value is then written to the counter register also in EEPROM memory and again, the write effects only one bit. In Step 410, the semaphore bit is cleared, and the counter increment algorithm is ended.

If the semaphore register is determined not to be zero in Step 404, then flow passes to Step 414 in which the value in the semaphore register is used to indicate which bits in the counter value may have been subjected to soft writes. These bits are then rewritten, and the corresponding semaphore bits are cleared as good writes take place. The use of the semaphore register provides secure synchronization between the encoder counter and the decoder counter because it provides a method by which the encoder can determine whether the previous counter increment was successful. Specifically, the last write to non-volatile memory for each increment of the counter is to the semaphore register. Since the battery power is constantly dropping during the memory write process, it is likely that if a defective, or soft write, occurred during the writing of the counter value, then the subsequent operation to clear the semaphore register will also be unsuccessful. Therefore, on the next attempt to increment the counter value, the decoder will recognize that the previous attempt was unsuccessful because the semaphore register is not cleared. Moreover, since the semaphore register at this point contains the last successful write to non-volatile memory, when power is restored, the encoder can use the semaphore register information to correct the counter register as in Step 414 thus "catching up" the counter value before the semaphore register is cleared in Step 416 and the next counter increment value is written to memory. Also, since the first write that takes place is the setting of the semaphore bit indicating which counter bit is to be changed, a low battery condition to start off with will not get to the process of writing to the counter.

In another embodiment of the invention, the semaphore register can be combined with a Gray counter to provide an even more secure method for maintaining synchronization between the encoder and the decoder. The semaphore operation above will protect against the incomplete write condition which can result from a good power source being removed intentionally.

Of course, even with the use of the semaphore register, the possibility still exists that a soft write could occur due to a low power condition, causing the encoder to fall out of synchronization with the decoder. Therefore, in still a further embodiment of the invention, there is provided a circuit for detecting the voltage level applied to the EEPROM memory.

Figure 5:
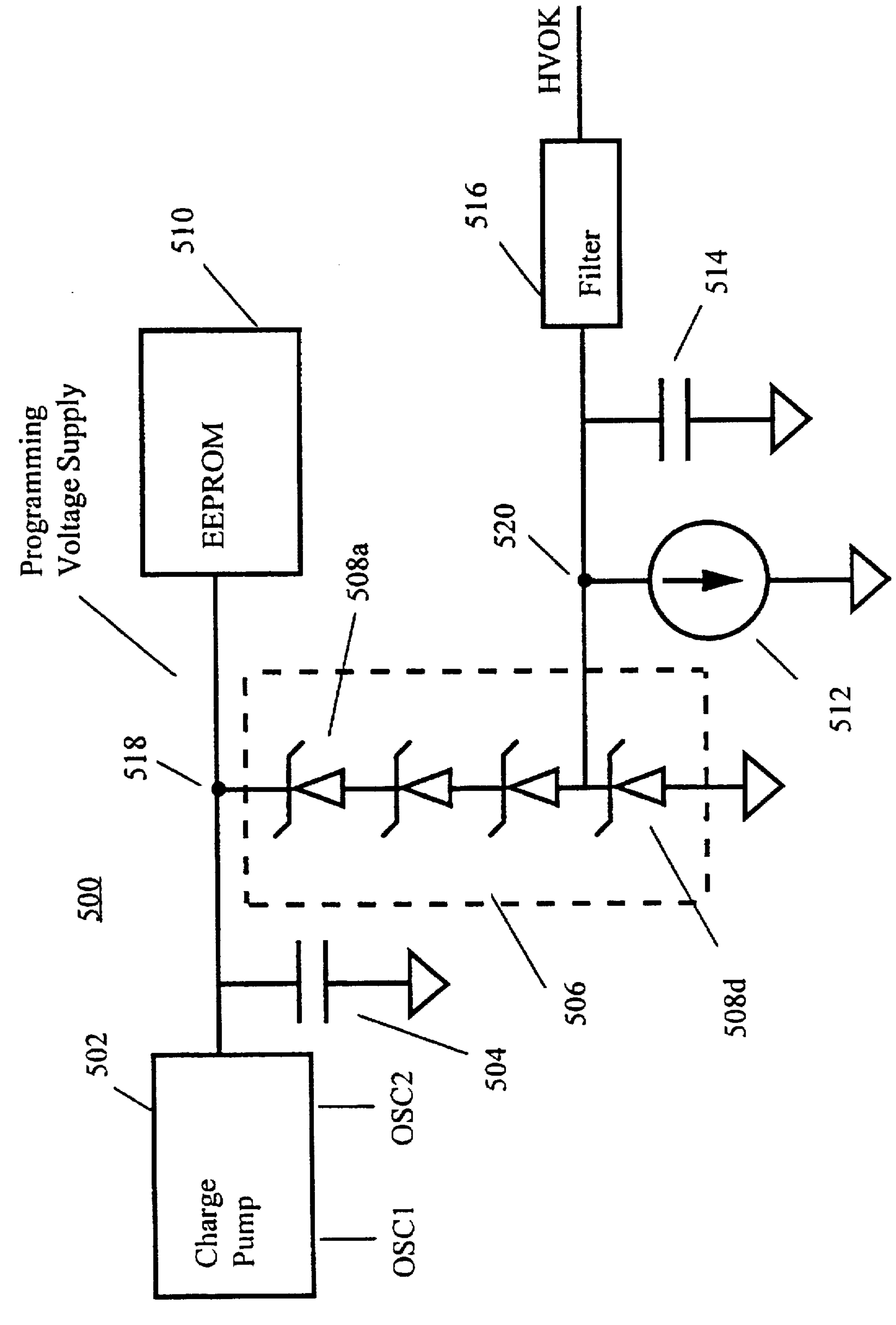
FIG. 5 is a schematic diagram of a high voltage testing circuit according to an embodiment of the invention.

FIG. 5 shows an embodiment of the invention in which a signal (HVOK) is used to determine whether a write to EEPROM memory is successful. In one embodiment of the invention, the HVOK (high voltage valid) signal is regarded as a criteria related to the quality of writes to non-volatile memory. The HVOK signal is monitored for a minimum period of time, and if deemed at an acceptable level for this time, the write to memory is regarded as good. If the HVOK signal drops below a defined threshold, the write process is regarded as invalid and is terminated. Of course, the thresholds chosen would depend on the particular technology being used to fabricate the invention. In a specific embodiment, a circuit 500 comprises a charge pump 502 which is driven by a pair of oscillators OSC1 and OSC2. The charge pump 502 provides a constant current output which charges capacitator 504. The charge in compacitator 504 builds up to the desired voltage, for example, 20 volts, needed to successfully write to EEPROM memory 510. In order to sense the charge on capacitator 504, there is provided a clamping circuit 506. In this embodiment, the clamping circuit is implemented as four series connected Zener diodes 508*a*–508*d*. However, other suitable clamping circuits are also used such as ground to gate transistors. For purposes of illustration, it is assumed that 20 volts is the desired EEPROM writing voltage at node 518, and that each of the Zener diodes 508*a*–508*d* has a five volt breakdown voltage.

Figure 5A:
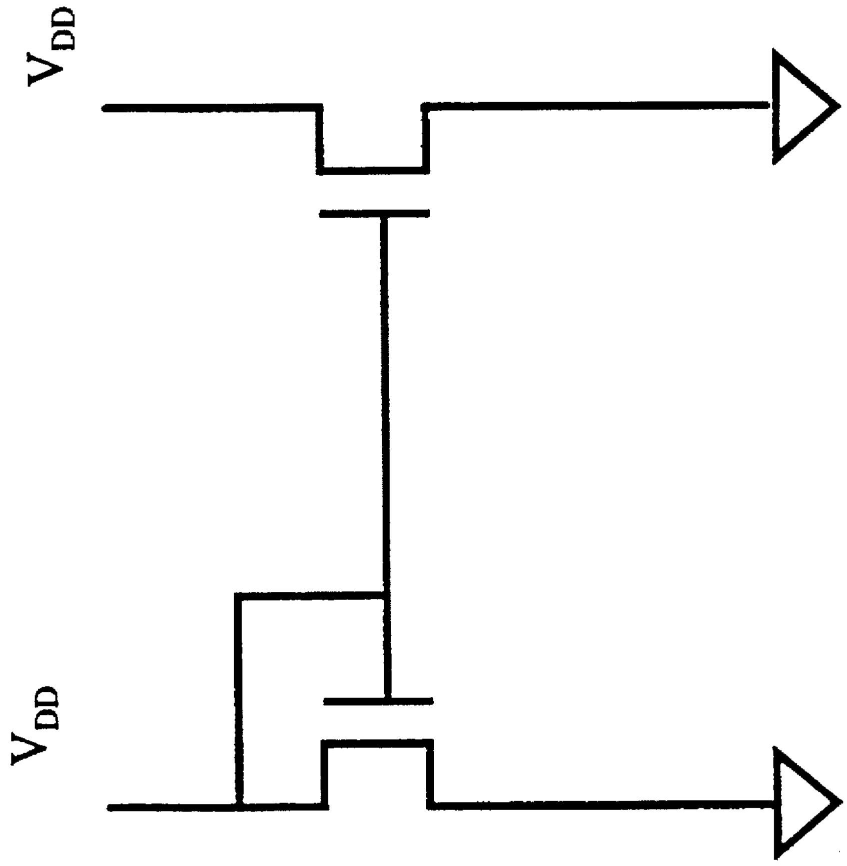
FIG. 5A is a schematic diagram of a current mirror circuit useful with the invention to provide a current source.

Connected between Zener diodes' 508*c* and 508*d* there is provided a small current source 512. The exact implementation of current source 512 is not critical and may be implemented in a manner most suitable to the technology used for the overall device. For example, in one embodiment the current source 512 comprises a current mirror circuit as shown in FIG. 5A. Other suitable ground sources would occur to those who are still in the art.

In an alternate embodiment of the invention, a resistor could be used in place of the current source. However, it should be noted that the value of the resistor may be voltage dependent and therefore not as accurate as a current mirror. Moreover, such a resistor would require more silicon area.

Assuming a 20 volt potential is required for a write to EEPROM memory 510, then 5 volts will be dropped across each of the Zener diodes 508*a*–508*d* when a sufficient potential is built up. Therefore, the voltage at node 520 will be 5 volts when a suitable memory write voltage is developed at node 518. Of course, due to the operation of the charge pump 502, the voltage at node 520 will not be a flat DC level, but will have a spike wave form which must be smoothed by Filter 516. In one embodiment, Filter 516 comprises a Schmitt trigger circuit. However, the exact implementation of the filter is not critical, and other suitable examples will occur to those who are skilled in the art. The output of Filter 516 is the HVOK signal which is sampled during every write to non-volatile memory. If the voltage level at node 518 is insufficient, this will be reflected in the HVOK signal.

Figure 5B:
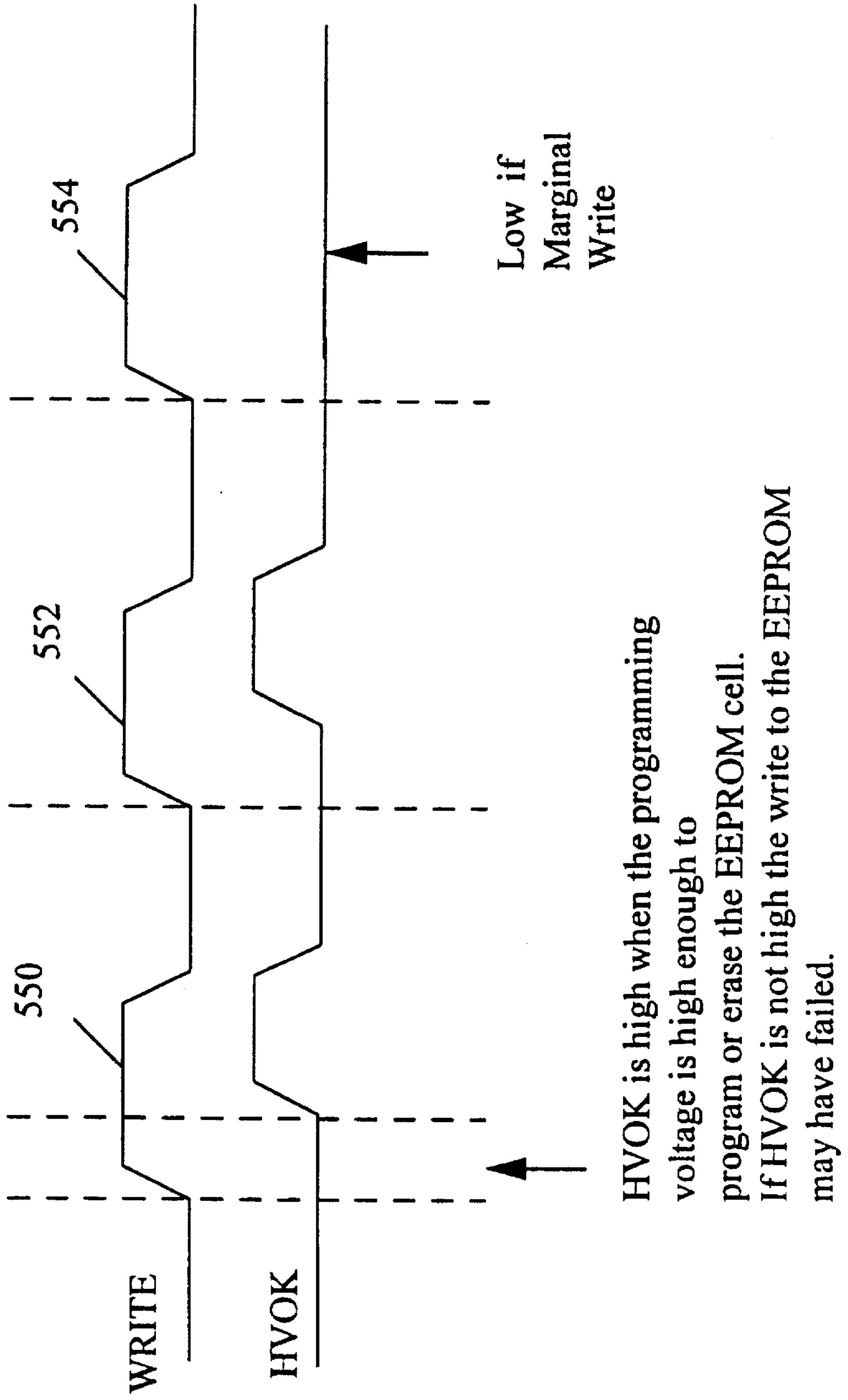
FIG. 5B is a timing diagram according to an embodiment of the presentation.

The HVOK signal is sampled during a write to EEPROM memory. This is shown in FIG. 5B which is a timing diagram according to the embodiment of the invention. In this version of the invention, incrementing the encoder counter involves three writes to EEPROM memory. The first write 550 is to the semaphore register as discussed previously. The next write 552 increments the counter value, and the last write 554 clears the semaphore register. During each write, the HVOK signal is sampled to insure that a proper voltage level exists at node 518. Of course, if the HVOK sample is found to be insufficient, then further writes to EEPROM memory are prevented.

In yet another embodiment of the invention, the HVOK circuit shown in FIG. 5 is actually used to reduce the power consumption by the encoder itself. This embodiment is of particular importance in devices which require extremely low power levels, such as externally powered transponders. In this embodiment, in order to avoid wasting energy by charging node 518 significantly over the 20 volt requirement, the HVOK signal is provided directly to the oscillators driving the charge pump 502. When the 20 volt write voltage is obtained at node 518, the HVOK signal shuts off the oscillators thus conserving energy which would otherwise be wasted in overcharging node 518.

What is claimed is:

1. An encoder comprising:

a processing circuit which generates an output code according to an encoding algorithm;

a circuit for generating a voltage acceptable signal responsive to a memory write voltage;

a non-volatile memory for storing a counter value;

control logic for incrementing the counter value responsive to the voltage acceptable signal; and a transmitter which transmits the output code and the counter value;

wherein said circuit for generating a voltage acceptable signal further comprises:

a charge pump;

a clamping circuit in electrical communication with an output of the charge pump;

a current source in electrical communication with the clamping circuit; and a filter in electrical communication with the current source.

2. An encoder as in claim 1 wherein the clamping circuit comprises a plurality of Zener diodes connected in series.

3. An encoder as in claim 2 wherein the current source comprises a current mirror circuit connected between a pair of the Zener diodes.

4. An encoder as in claim 1 wherein the filter comprises a Schmitt trigger.

5. An encoder as in claim 1 further comprising an oscillator which drives the charge pump, wherein the oscillator is responsive to the voltage acceptable signal such that when the clamping circuit sets the write voltage to a desired level, the voltage acceptable signal prevents the oscillator from further driving the charge pump.

* * * * *